(12) United States Patent
Lam et al.

(10) Patent No.: US 8,614,911 B2
(45) Date of Patent: Dec. 24, 2013

(54) ENERGY-EFFICIENT ROW DRIVER FOR PROGRAMMING PHASE CHANGE MEMORY

(75) Inventors: Chung H. Lam, Peekskill, NY (US); Jing Li, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 13/335,155

(22) Filed: Dec. 22, 2011

(65) Prior Publication Data

US 2013/0163320 A1    Jun. 27, 2013

(51) Int. Cl.
*G11C 11/00* (2006.01)

(52) U.S. Cl.
USPC .......................................... 365/163; 365/158

(58) Field of Classification Search
USPC ................................................. 365/163, 158
See application file for complete search history.

(56) References Cited

U.S. PATENT DOCUMENTS

| | | | |
|---|---|---|---|
| 6,426,891 B1 | 7/2002 | Katori | |
| 6,914,801 B2 | 7/2005 | Kostylev et al. | |
| 7,332,735 B2 | 2/2008 | Campbell | |
| 7,359,246 B2 | 4/2008 | Sforzin et al. | |
| 7,391,642 B2 | 6/2008 | Gordon et al. | |
| 7,417,900 B2 | 8/2008 | Rolandi et al. | |
| 7,420,851 B2 | 9/2008 | Fasoli | |
| 7,423,897 B2 | 9/2008 | Wicker | |
| 7,486,536 B2 | 2/2009 | Kim et al. | |
| 7,499,315 B2 | 3/2009 | Lowrey et al. | |
| 7,515,459 B2 | 4/2009 | Kang et al. | |
| 7,554,861 B2 | 6/2009 | Vimercati et al. | |
| 7,567,473 B2 | 7/2009 | Breitwisch et al. | |
| 7,602,632 B2 | 10/2009 | Breitwisch et al. | |
| 7,606,055 B2 | 10/2009 | Liu | |
| 7,626,858 B2 | 12/2009 | Happ et al. | |
| 7,656,710 B1 | 2/2010 | Wong | |
| 7,660,147 B2 | 2/2010 | Chao et al. | |

(Continued)

FOREIGN PATENT DOCUMENTS

EP    0 626 758 A2    11/1994

OTHER PUBLICATIONS

G.W. Burr et al., "Phase change memory technology," Journal of Vacuum Science & Technology B: Microelectronics and Nanometer Structures, vol. 28, No. 2, Mar./Apr. 2010, pp. 223-262.

(Continued)

*Primary Examiner* — Michael Tran
(74) *Attorney, Agent, or Firm* — Scully, Scott, Murphy & Presser, P.C.; Daniel P. Morris, Esq.

(57) ABSTRACT

A drive circuit and method for parallel programming a plurality of phase change memory (PCM) cells includes a first signal generator device for generating a slow ramping signal; an adiabatic computing element receives the slow ramping signal and responsively generates an output slow ramping signal in adiabatic fashion, the output slow ramping signal applied to the single wordline conductor associated with each PCM cell of the plurality of cells being programmed in a time interval. Each PCM cell of the plurality being programmed is connected to a respective bitline conductor. A second signal generator generates, during the time interval, one or more bitline signals for input to a respective bitline conductor of a respective PCM cell. A state of the applied slow ramping output signal and the one or more bitline signals during the time interval governs a programmed state of the PCM cell.

19 Claims, 7 Drawing Sheets

(56) References Cited

U.S. PATENT DOCUMENTS

| | | | |
|---|---|---|---|
| 7,663,137 | B2 | 2/2010 | Campbell |
| 7,663,618 | B2 | 2/2010 | Svensson et al. |
| 7,684,227 | B2 | 3/2010 | Liu et al. |
| 7,696,077 | B2 | 4/2010 | Liu |
| 7,729,163 | B2 | 6/2010 | Ramani et al. |
| 7,745,231 | B2 | 6/2010 | Liu et al. |
| 7,754,522 | B2 | 7/2010 | Liu |
| 7,755,939 | B2 | 7/2010 | Tamada |
| 7,796,424 | B2 | 9/2010 | Happ et al. |
| 7,817,475 | B2 | 10/2010 | Lowrey |
| 7,929,338 | B2 | 4/2011 | Franceschini et al. |
| 2007/0029537 | A1 | 2/2007 | Campbell |
| 2007/0034905 | A1 | 2/2007 | Elkins |
| 2007/0121364 | A1 | 5/2007 | Bertin et al. |
| 2007/0158631 | A1 | 7/2007 | Daley et al. |
| 2007/0268742 | A1 | 11/2007 | Liu |
| 2008/0014733 | A1 | 1/2008 | Liu |
| 2008/0044632 | A1 | 2/2008 | Liu et al. |
| 2008/0062752 | A1 | 3/2008 | Giovinazzi et al. |
| 2008/0142773 | A1 | 6/2008 | Campbell |
| 2008/0258125 | A1 | 10/2008 | Liu et al. |
| 2008/0298113 | A1 | 12/2008 | Liu et al. |
| 2008/0298114 | A1 | 12/2008 | Liu et al. |
| 2009/0196095 | A1 | 8/2009 | Liu |
| 2009/0213653 | A1 | 8/2009 | Perlmutter et al. |
| 2009/0244961 | A1 | 10/2009 | Ramani et al. |
| 2009/0303785 | A1 | 12/2009 | Hwang et al. |
| 2010/0008163 | A1 | 1/2010 | Liu |
| 2010/0020594 | A1 | 1/2010 | De Sandre et al. |
| 2010/0028421 | A1 | 2/2010 | Cumming et al. |
| 2010/0034016 | A1 | 2/2010 | Liu |
| 2010/0110779 | A1 | 5/2010 | Liu et al. |
| 2010/0144087 | A1* | 6/2010 | Ha et al. .................. 438/102 |
| 2010/0214830 | A1 | 8/2010 | Franceschini et al. |
| 2010/0283029 | A1 | 11/2010 | Dennison et al. |
| 2011/0063902 | A1* | 3/2011 | Lung ........................ 365/163 |
| 2011/0292749 | A1* | 12/2011 | Park ......................... 365/203 |
| 2011/0305074 | A1* | 12/2011 | Lung et al. ............... 365/163 |
| 2012/0051123 | A1* | 3/2012 | Liu ........................... 365/163 |
| 2012/0248399 | A1* | 10/2012 | Sasago et al. ............... 257/4 |

OTHER PUBLICATIONS

S. Kostylev et al., "Drift of programmed resistance in electrical phase change memory devices," Proc. E*PCOS 2008, Prague, 2008, pp. 117-124.

D.-H. Kang et al., "Two-bit Cell Operation in Diode-Switch Phase Change Memory Cells with 90nm Technology," Symposium on VLSI Technology, 2008l pp. 98099.

Y.-H. Chiu et al., "Impact of Resistance Drift on Multilevel PCM Design," IC Design and Technology, ICICDT, 2010, pp. 20-23.

Liu et al., "Pass-transistor adiabatic logic with NMOS pull-down configuration" Electronics Letters Apr. 16, 1998, vol. 34, No. 8, p. 739 col. 2 to p. 740, col. 2.

International Search Report and Written Opinion mailed Feb. 8, 2013 in PCT/US 12/66575.

\* cited by examiner

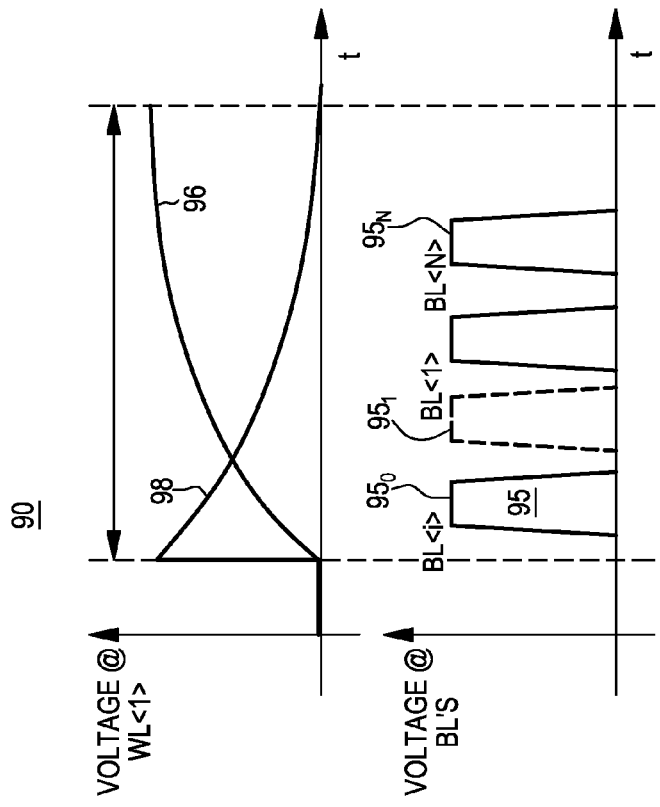
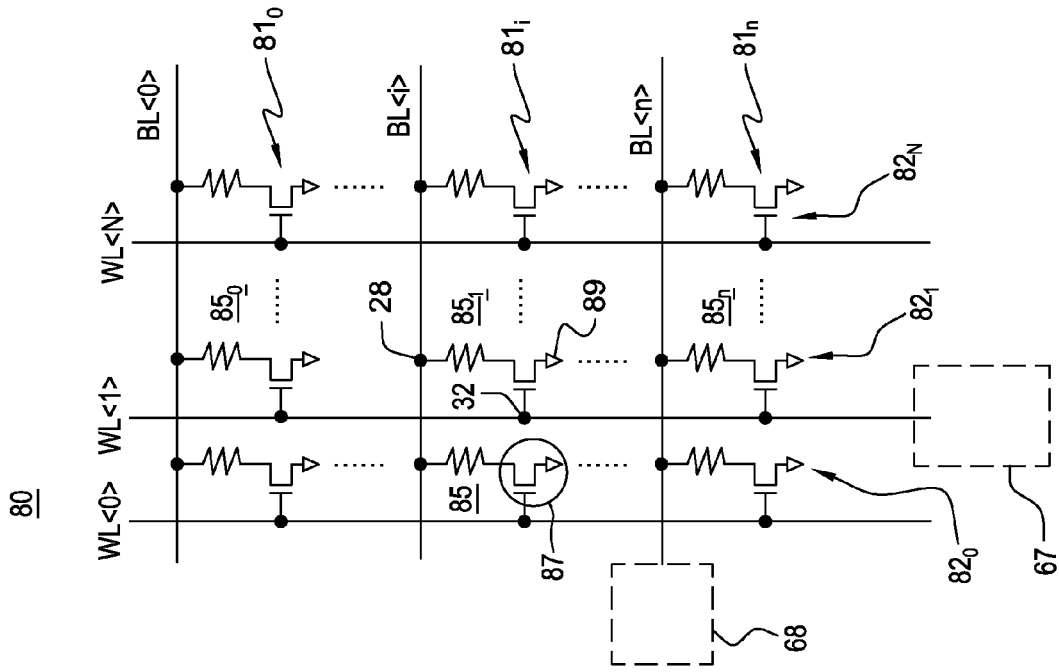
FIG. 4
FIG. 3

ENERGY-EFFICIENT ROW DRIVER FOR PROGRAMMING PHASE CHANGE MEMORY

BACKGROUND

The present disclosure relates to semiconductor memory and data storage devices, and methods of operating memory storage devices. More particularly, there is described, an energy-efficient row driver circuit implemented in a system for programming arrays of phase change memory cells for high bandwidth.

A Phase Change Memory (PCM) cell includes a memory element of a phase change material having a first state, in which the phase change material is fully crystalline and has a minimum resistance level, a second state in which the phase change material is fully amorphous and has a maximum resistance level, and a plurality of intermediate states, in which the phase change material includes a mixture of both crystalline regions and amorphous regions having intermediate resistance values.

As known, the amorphous phase of a PCM tends to have high electrical resistivity, while the crystalline phase exhibits a low resistivity, e.g., orders of magnitude lower. Due to this large resistance contrast, the change in sensing signal between fully crystalline state and fully amorphous state is quite large, permitting for the immediate multiple analog levels needed for multi-level cell (MLC) operations.

In a PCM cell set or reset operation, a larger electrical current is applied in order to melt the central portion of the cell, and if this pulse is terminated abruptly, the molten material quenches into the amorphous phase, producing a cell in the high-resistance state. The reset operation tends to be fairly current and power hungry, and thus care must be taken to choose an access device capable of delivering high current and power without requiring a significantly larger footprint than the PCM element itself.

The read operation of a PCM cell is performed by measuring the device resistance at low voltage so that the device state is not perturbed.

Typical semiconductor computer memories are fabricated on semiconductor substrates consisting of arrays of large number of physical memory cells. In general, one bit of binary data is represented as a variation of a physical or electrical parameter associated with a memory cell. Commonly used physical/electrical parameters include a threshold voltage, Vth, variation of Metal Oxide Field Effect Transistor (MOSFET) due to the amount of charge stored in a floating gate or a trap layer in nonvolatile Electrically Erasable Programmable Read Only Memory (EEPROM), or resistance variation of the phase change element in Phase-change Random Access Memory (PRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as a Multi-Level Cell (MLC). Significant amount of effort in computer memory device and circuit designs is devoted to maximize the number of bits to be stored in a single physical memory cell. This is particularly true with storage class memory, e.g., non-volatile Flash memories commonly used as mass storage devices.

FIG. 1 illustrates an iterative write system and methodology implemented for adaptively controlling the amplitude of each programming pulse in a sequence of write-verify steps. That is, in a prior art methodology 60, to achieve multiple resistance levels in a PCM cell 50, there is applied an adaptive algorithm 65 programmed to provide current pulse governed according to formula 1) as follows:

$$I(k+1)=I(k)+\alpha \cdot e(k) \quad \quad 1)$$

where I( ) is the applied current for programming each bit, k is the number of the iterations for multi-level cell programming. In FIG. 2, R(k) is a sensed parameter value, e.g., sensed resistance value, determined after application of programmed current pulse, $R_{REF}$ is a reference value of a parameter (e.g., a desired Resistance level) value e(k) is a error correction term representing a difference 62 between the programmed (desired) resistance value for the current PCM bit R(k) and the actual determined resistance value R(k) as a result of the pulse application in the current iteration. This error correction term is weighted by a value α and fed back to the adaptive algorithm 65 to reduce the number of iterations to achieve target resistance values among the PCM cells as governed according to formula 1).

FIG. 2A particularly depicts a prior art operation of a write-verify sequence 60 for physical programming of bit values (e.g., analog states) into a PCM cell 50. As shown, the PCM cell 50 includes a bit line terminal 28 and a control access device (e.g., a transistor) 30 including one transistor terminal (e.g., source or drain) connecting the PCM and a transistor gate providing a second or wordline terminal 32. In one embodiment, voltage present at the wordline (WL) terminal 32 in the manner as shown in FIG. 2B, configures the control access device, e.g., transistor 30, to control current flow through the PCM cell as it is being programmed. In the operation of the iterative write system and methodology implemented for adaptively controlling the amplitude of each programming pulse in a write-verify sequence 60, the voltage at the wordline is first SET/RESET by application of a pulse 52 to place the cell in an initial state and, with the bitline terminal held at a constant voltage, a next pulse 54a is injected at the WL terminal 32 that is immediately followed by a read operation 55 for reading in the programmed PCM cell value resulting from the application of signal 54a injected at the wordline terminal.

Referring back to FIG. 2A the read value is evaluated according to the programmed reference parameter value, e.g., a programmed reference resistance state ($R_{ref}$), and the calculated difference (e.g., error) is processed and fedback to a signal generator to provide a next pulse value shown as 54b for application to the WL terminal 32 immediately followed by a read operation 55 for reading in the programmed PCM cell value resulting from the application of signal 54b injected at the wordline terminal. If, as evaluated by processing after a read operation 55, the intended programmed reference resistance state ($R_{ref}$) is not achieved, then, based on the error difference, further steps may be employed to apply a next calculated WL pulse 54c for injected at the WL terminal 32 immediately followed by the read operation 55 for reading in the programmed PCM cell value resulting from the application of signals 54c and verifying whether the programmed resistance value had been achieved. The write-verify iterative process continues executing these steps until the programmed target ($R_{ref}$) parameter value, e.g., resistance, for that cell (or bit) has been reached.

It should be understood that, in the embodiment depicted in FIGS. 2A, 2B, the pulse voltages 54a, 54b, etc., can be applied to the PCM cell WL terminal 32 (while keeping the voltage at BL terminal 28 constant) or the pulse voltages 54a, 54b, etc., can be applied to the PCM cell BL terminal 28 while keeping voltage at the WL terminal 32 constant. In either application, for each iteration, the state of the memory cell is always initialized, making it highest R (fully RESET the cell) or making it lowest R (fully SET the cell), then perform iterative programming-verify operation.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is typically the limiting factor for multiple bit memory storage.

Moreover, in current iterative programming schemes, it is expensive to write many cells in parallel due to the large area overhead from the control logic. Each cell needs separate control and each iteration needs to go through a whole loop including digital to analog (DAC), analog to digital (ADC) and other control logic.

It would be highly desirable to provide an energy-efficient row driver circuit which can generate a slow ramping signal for writing to many cells in parallel without consuming too much power.

SUMMARY

An efficient row driver circuit and apparatus for use in the parallel programming scheme for writing multiple bits in phase change (PCM) memory cell structures.

An ultra-low power row-driver circuit and apparatus for parallel programming multi-bit phase change memory can be used for programming a plurality of PCM cells programmed according to parallel programming methods for Multi-Level Cell applications. The row-driver circuit, in one embodiment, generates one or more PCM cell programming signals in adiabatic fashion, resulting in very small energy dissipation.

Accordingly, there is provided a method for programming a phase change memory (PCM) cell in a PCM memory cell array having a plurality of rows of word lines connected at respective word line terminals of the memory cells and plurality of columns of bit lines connected at respective bit line terminals of the memory cells, the method comprising:
applying a first signal to a word line terminal in an adiabatic fashion to select a row of memory cells for programming those PCM cells associated with the wordline; and, applying one or more second signals to respective bit line terminals of selected one or more memory cells of the selected row concurrent with the applying the first signal to the word line terminal.

Further to this aspect, the applying of the first signal comprises: generating, via a first signal generator device, an input signal; receiving the input ramped signal at an adiabatic logic device and responsively generating an output ramping signal in adiabatic fashion, the output ramping signal applied for a defined time duration to a wordline of the selected row.

In a further aspect, there is provided a drive circuit for parallel programming a plurality of phase change memory (PCM) cells organized as an array of memory cells having a plurality of rows of word lines connected at respective word line terminals of the PCM cells and plurality of columns of bit lines connected at respective bit line terminals of the memory cells, each PCM cell of the row addressable via a single wordline conductor at a wordline terminal of each the PCM cell, the circuit comprising: a first signal generator device for generating a ramped signal; a first set of selectable adiabatic logic devices, each adiabatic logic device configured to receive the ramped signal; a decoding device generating a signal for selecting an individually selectable adiabatic logic device of the first set of selectable adiabatic logic devices to receive the ramped signal, a selected adiabatic logic device outputting, in response to receiving the ramped signal, an output ramping signal in the adiabatic fashion, the output ramping signal applied for a defined time duration to the single wordline conductor of a selected row; and, a second signal generator device for applying one or more second signals to respective bit line terminals of the memory cells of the selected row concurrent with the applying the output ramping signal to the word line terminal.

In a further aspect, there is provided a drive circuit for parallel programming a plurality of phase change memory (PCM) cells organized as an array of memory cells having a plurality of rows of word lines connected at respective word line terminals of the PCM cells and plurality of columns of bit lines connected at respective bit line terminals of the memory cells, each PCM cell of the row addressable via a single wordline conductor at a first terminal of each the PCM cell, the circuit comprising: a first signal generator device for generating a ramped signal; a first set of selectable adiabatic logic devices, each adiabatic logic device of the first set configured to receive the ramped signal and generate an intermediate output ramping signal in adiabatic fashion, a second set of adiabatic logic devices, each adiabatic logic device of the second set configured to receive the intermediate output ramping signal and generate an output ramping signal in adiabatic fashion, the output ramping signal applied for a defined time duration to the single wordline conductor of a selected row; a decoding device generating a signal for selecting an individually selectable adiabatic logic device of the first set of selectable adiabatic logic devices to receive the input ramped signal, and for selecting an individually selectable adiabatic logic device of the second set of selectable adiabatic logic devices to receive the intermediate output ramping signal; and, a second signal generator device for applying one or more second signals to respective bit line terminals of the memory cells of the selected row concurrent with the applying the output ramping signal to the word line terminal.

Advantageously, the efficient driver circuit and apparatus is configured for use in a system and method of parallel programming of a Multi-Level PCM memory cell that implements an iterative write-verify programming technique that enables reading of a characteristic parameter after the programming for verification. The iterative write-verify programming technique provides the ability to maximize the information storage capacity of each cell, i.e., increase the number of bits stored per cell.

BRIEF DESCRIPTION OF THE DRAWINGS

The present invention will be described with reference to FIG. 1-11. When referring to the figures, like elements shown throughout are indicated with like reference numerals.

FIG. 3 particularly shows a memory apparatus organized as a plurality of memory cells programmed in accordance with a parallel programming scheme;

FIG. 4 shows a plot of applied voltages in the parallel programming method, each wordline pulse being slow ramping (e.g., slow rise time or slow fall time);

DETAILED DESCRIPTION

Figure 1:
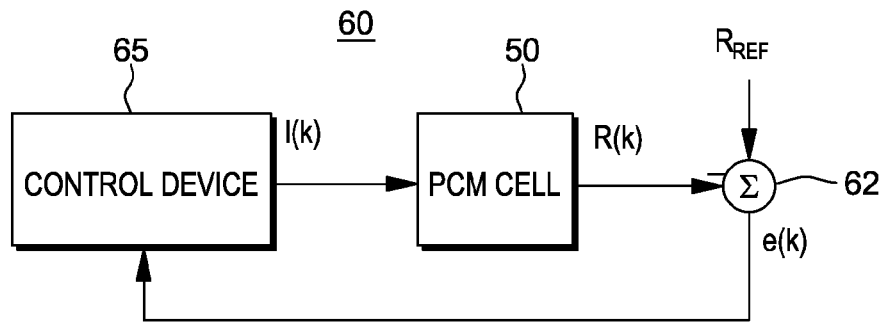
FIG. 1 illustrates an example prior art iterative write methodology implemented for adaptively controlling the amplitude of each programming pulse in a sequence of write-verify steps.
Figure 2A:
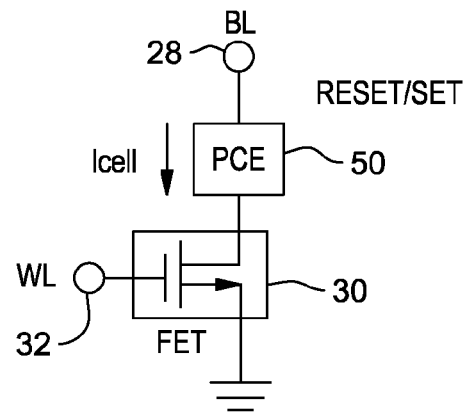
FIG. 2 shows a plot depicting an example programmed voltage curve applied to the PCM cell and the resulting PCM cell Resistance values as a function of the applied voltages.
Figure 2B:
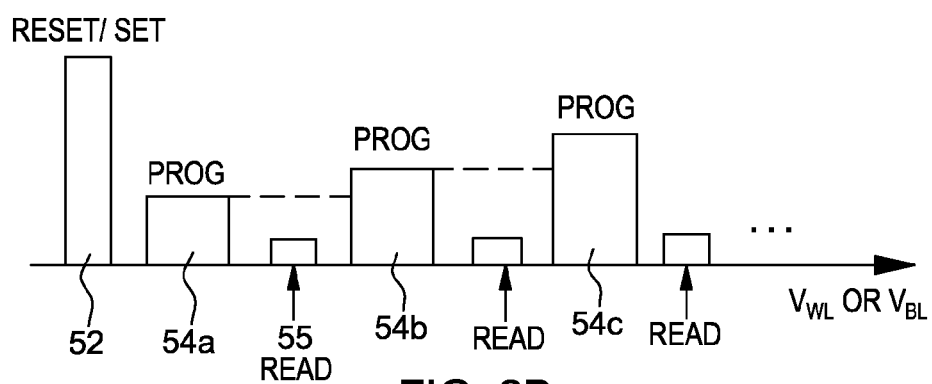

In order to write multiple bits more efficiently in MLC (PCM) cells, a parallel programming scheme has been proposed such as described in co-pending U.S. patent application Ser. No. 13/335,310, incorporated by reference herein. In the scheme, a slow pulse is applied to WL with gradual increase or decrease in amplitude (i.e., gradual rising or falling). As a slow ramping signal applied to WL poses a lot of challenges in row driver design, the present disclosure describes an energy-efficient adiabatic row driver which can generate slow ramping signal without consuming too much power. It is understood that the adiabatic row-driver circuitry described herein may be used in other low power consuming applications.

A parallel programming apparatus and method for writing multiple bits in parallel to a multi-level PCM cell (MLC) more efficiently using an adiabatic row-driver circuit and programming scheme described herein, is now described in connection with FIG. 3.

According to an example embodiment, an efficient row-drive circuit is used for programming multiple phase change memory cells sharing a common word line in a parallel fashion, whence the voltage pulse applied to the word line is ramped; programming pulses of variable amplitude, width and trailing edge are applied to the bit line at variable time interval during the ramp of the word line pulse thus achieving multi-bit parallel programming.

FIG. 3 particularly shows a PCM cell memory array 80 formed and programmed in accordance with the parallel programming MLC scheme. As shown, formed in a semiconductor substrate, e.g., silicon, silicon-germanium or varieties of others, a plurality of structures including the programmable PCM cell elements 85 having formed cell access control device 87 (e.g., a transistor such as a FET/MOSFET) connected at one end using known semiconductor manufacturing lithographic masking, etching, and deposition techniques.

As shown in FIG. 3, each individual PCM memory cell 85 has first and second terminals, wherein the first terminals of the plurality of cells couple to a common WL conductor (e.g., WL<0>, WL<1>, . . . , WL<N>) and each of the second terminals of said plurality of cells couple to a respective individual BL conductor (e.g., BL<0>, BL<1>, . . . , BL<N>).

More particularly, each phase change memory cell 85 includes a first WL terminal 32 that receives WL signal input(s) at the gate of its respective access control transistor 87 with its drain or source terminal connected to the PCM cell and the other (source or drain) terminal connected to ground or neutral voltage potential 89. Further, each phase change memory cell 85 includes a conductive bit line BL terminal 28 connected at other end to receive BL signal inputs. As described herein below, in one embodiment, each respective PCM cell 85 access control transistor 87 receiving a wordline WL signal at its gate terminal 32 is used to control the programming of PCM cell 85 by controlling current through the PCM cell 85. Particularly, in the parallel programming scheme described herein, there is performed application of WL signal(s) and simultaneous application of one or more BL pulse(s) that controls the programming of each cell 85 of one or more columns.

More particularly, in FIG. 3, the programmable PCM memory device 80 includes an array of PCM memory structures 85, and in an example non-limiting implementation, is organized as "n" rows $81_0, 81_1, 81_n$ and "N" columns $82_0, 82_1, 82_N$ of memory cells. For example, each respective structure 85 of a respective column, e.g., MLC structures $85_0, 85_1, \ldots, 85_n$, is associated with a single formed electrically conductive wordline, e.g., wordline conductor WL<1>, and is connected at one end to the WL terminal 32 at the gate of transistor 87. Each structure MLC structures $85_0, 85_1, \ldots, 85_n$ of each column are each connected at a respective row at a second terminal 28 to a respective associated electrically conductive bit line, e.g., bit lines BL(0), BL(1), . . . , BL(n) as shown in FIG. 4. Each PCM structure 85 is independently programmable; however, according to the parallel programming scheme, a plurality of multiple resistive states can be programmed at a time, i.e., MLC structures $85_0, 85_1, \ldots, 85_n$ in one or more columns may be simultaneously programmed.

In such a scheme, as shown in FIG. 3, there is provided an efficient row driver apparatus 67 (e.g., including one or more adiabatic logic devices/circuitry, one or more programmable clock, pulse or ramp signal generator) that applies a WL ramp signal for charging a respective word line (WL) of the PCM cells 85 when being programmed during write-verify iterative programming. Further, one or more BL signal generator devices indicated as a generator device 68 (e.g., including one or more programmable clock, pulse or ramp signal generators and selecting logic) are provided that can simultaneously apply the BL pulse(s) to bit lines connecting the PCM cells 85 being programmed according to the write-verify programming algorithm that governs the application of WL and corresponding application of BL pulses for programming a plurality of cells in the array 80.

In the programming methodology, indicated as a schematic 90 shown in FIG. 4, a single WL voltage or current signal is applied at a WL terminal while plural BL voltage or current signals are applied at respective bit lines. That is, FIG. 4 plots voltages directly applied to the WL and BL terminals of each plurality of PCM cells in the parallel programming method. As shown, each applied wordline signal 90 is slow ramping. For example, an applied WL signal can be a ramp signal 96 of slow rise time, i.e., WL signal of gradually increasing amplitude (e.g. 0V-2.5V) over a defined time duration "T" (e.g., about 10 µs in one embodiment), or a ramp signal of slow fall time, i.e., WL signal of decreasing amplitude (2.5V-0V) over a defined time duration "T" (e.g., about 10 µs). In one aspect, an efficient word line row driver is provided that can generate slow ramping signals 96, 98 without consuming any significant power.

In one aspect, the parallel programming scheme is used to simultaneously program many cells that are connected on the same WL. Thus, for example, as shown in FIG. 4, a falling (or rising) pulse 98 (96) applied to a WL (e.g., WL<1>) having gradual decrease (or increase) in amplitude is applied for a time interval "T". In one embodiment, the fall time or rise time is slow e.g., about a slew rate of ±0.25V/µs in an example implementation). As shown, the concurrent programming of the plural cells 85 connected to the WL<1> includes the concurrent application of a BL pulse(s) 95 at each BL of much shorter time duration (e.g., 10's ns) than WL's ramped signal duration (e.g., 10's µs), within the time duration T. That is, as shown in FIGS. 3 and 4, to simultaneously program PCM cells $85_0, 85_1, \ldots, 85_n$ during application of WL signal 96 or 98, a BL pulse 95(0), 95(1), ..., 95(N) is concurrently applied at a respective bit line (e.g., bitlines BL(0), ... BL(N)) within time interval T. In the embodiment depicted in FIG. 4, each applied BL pulse 95(0), 95(1), ..., 95(N) is shown starting at different programmed time points depending upon the target parameter being programmed into the respective cell (i.e., resistance level) connected at the respective bit line. Generally, by changing a BL voltage or current pulse attribute, e.g., application of voltage start times within the WL turning-on time, various currents are achieved for programming different resistance levels (states).

In one embodiment, different BL's can be pulsed by signal generators in module 68 to realize parallel programming. A slow signal transition on WL terminal results in larger number of cells sharing the same row driver 67 which improve bandwidth.

In a further aspect, the parallel programming scheme is used to simultaneously program plural cells 85 that are connected on multiple WLs in different array partitions 80. Thus, in other subarrays as array 80 shown in FIG. 3, a gradual falling (or rising) ramped pulse 98 (96) may be simultaneously applied by programmed generators 67 to a word line (e.g., WL<0> or WL<1>, ... or WL<N>) for a time duration "T". The programming of the plural cells 85 connected to the common WL (either WL<0>, WL<1>, ..., WL<N>) includes the concurrent application of one or more BL pulse(s) 95 at each BL (e.g., BL(0), BL(1), ..., BL(n)) within the time duration T. That is, as shown in FIG. 4, a signal 96 or 98 may be applied to a respective PCM cells 85 at each of one or more WLs in different array partitions during application of WL signal 96 or 98, and one or more BL pulses 95(0), 95(1), ..., 95(N) are concurrently applied at a respective bit line (e.g., bitlines BL(0), ... BL(N)) in a manner dependent upon the target reference parameter being programmed into the cell (i.e., resistance level). By changing the pulse attributes of applied BL pulses, e.g., BL voltage starting times within the WL turning-on time, various currents are achieved for programming different resistance levels (states).

Figure 10:
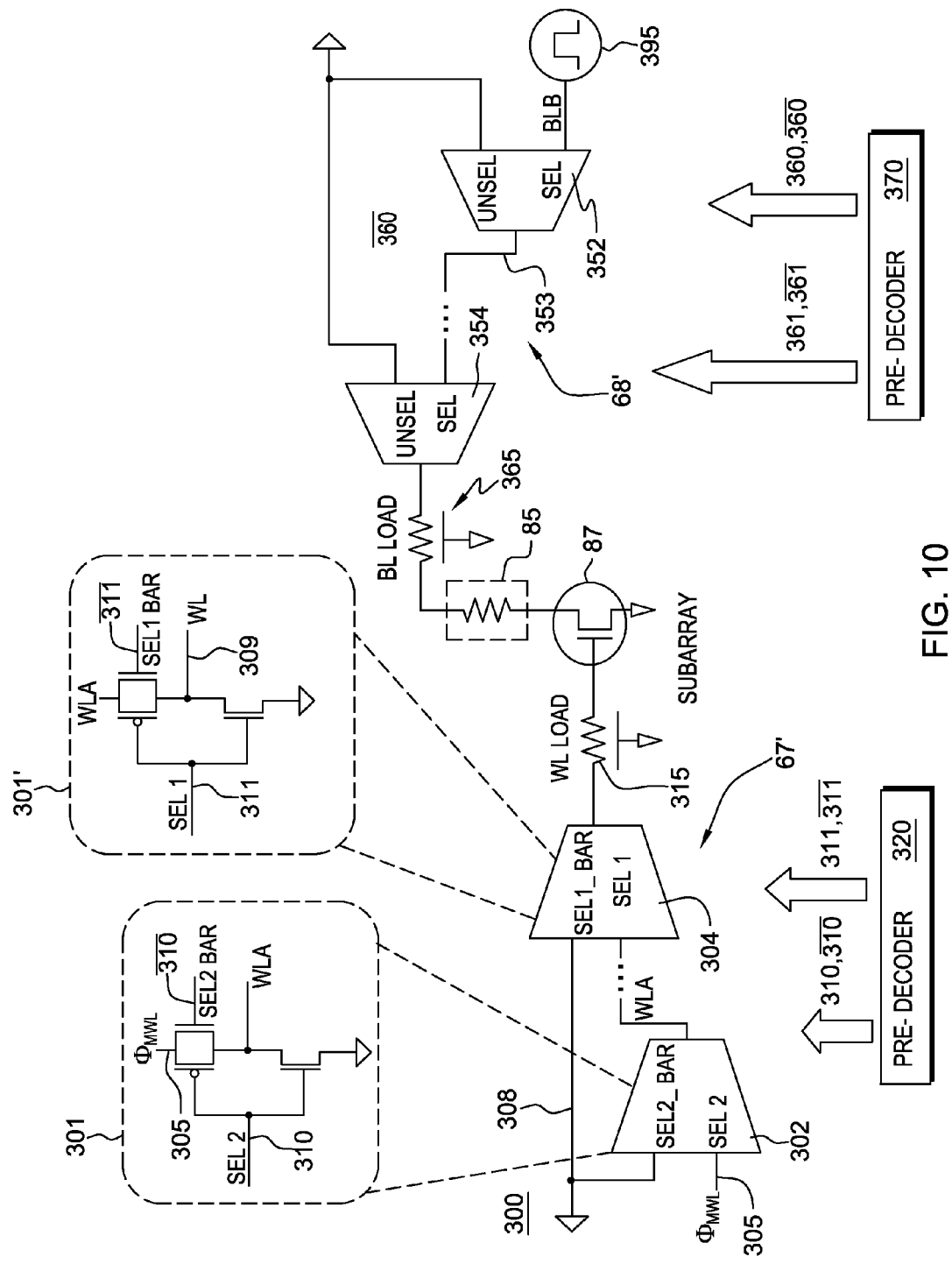
FIG. 10 is a system diagram depicting an energy-efficient row driver circuit 300 to generate a slow ramping signal for an adiabatic row decoding scheme according to one embodiment.
Figure 10A:
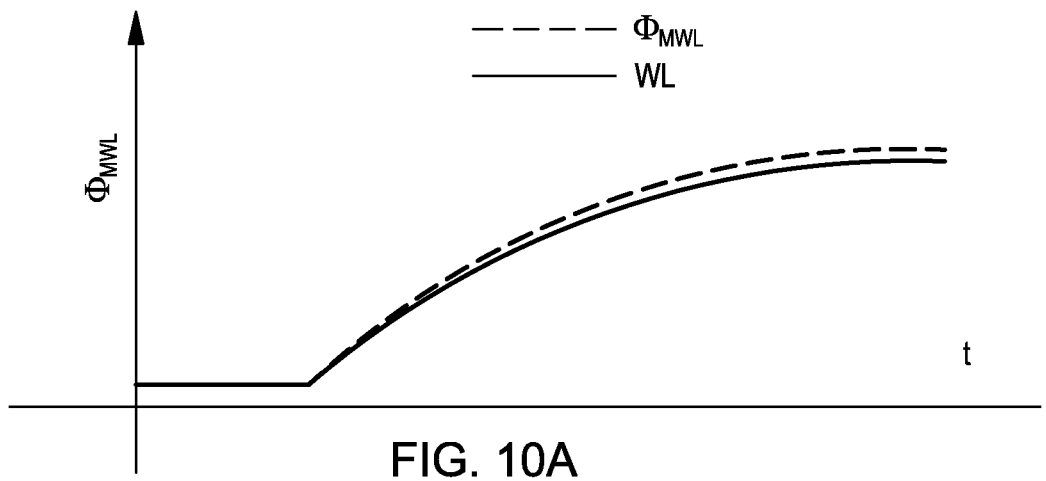
FIG. 10A is a plot depicting the adiabatic generation of WL drive signal by row driver circuit 300 shown in FIG. 10.

As described in herein incorporated commonly-owned, co-pending U.S. patent application Ser. No. 13/335,310, to program the MLC in parallel in a more energy efficient and area efficient manner, the system for programming multiple bits of the PCM cell array includes a row driver circuit utilizing an adiabatic computing approach. Thus, for example, an energy-efficient row driver circuit 300 shown and described with respect to FIG. 10, is used to program the MLC in parallel in a more energy efficient and accurate manner. This row driver circuit 300 utilizes an adiabatic computing approach that saves power and enables driving very long word lines for parallel programming to build efficient large arrays such as the apparatus 80 of FIG. 3.

Figure 9A:
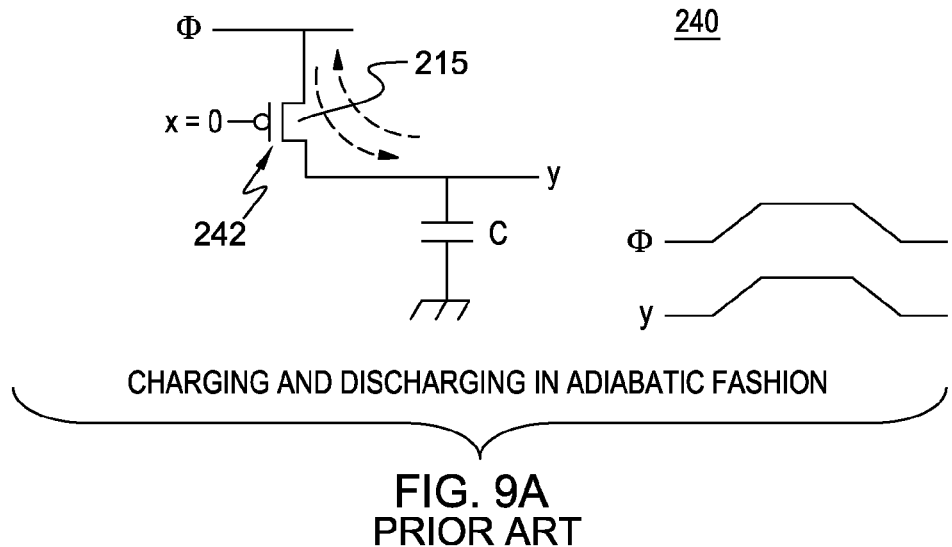
FIG. 9A depicts an adiabatic computing logic element 240 that operates according to an adiabatic circuit principle.
Figure 9B:
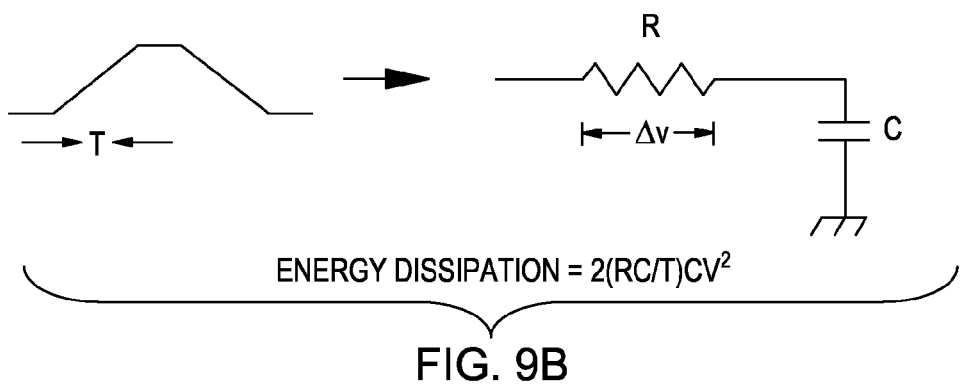
FIG. 9B depicts an equivalent circuit for logic element 240 that dissipates energy according to an adiabatic circuit principle.
Figure 9C:
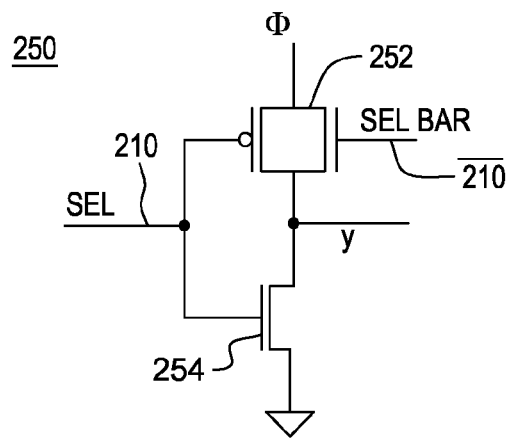
FIG. 9C depicts a CMOS adiabatic circuit architecture 250 including both a PMOS transistor device 254 and NMOS transistor device 252 that can be employed in a row-driver circuit shown in FIG. 10 according to one embodiment.

Operation according to an adiabatic circuit principle is now shown and described with respect to FIGS. 9A-9C. For example, as shown in a charging circuit 240 of FIG. 9A, there is shown a PMOS transistor device 242 and connected capacitive load, represented by capacitor "C", without use of a complementary CMOS device (i.e., no NMOS transistor), a conductor labeled "x" at the gate of PMOS device 242 is provided with a voltage held constant (e.g., x=0 Volts) and, the supply voltage represented as Φ swings gradually (e.g., ramps) from 0 to $V_{dd}$ (e.g., during an evaluation phase) and then swing back from $V_{dd}$ to 0 (e.g., during a restoration phase). The output at conductor "y" tracks this signal output exactly such that, during the whole period, there is always very little voltage drop across the channel 215 of PMOS device. Hence, only a small amount of energy is dissipated in adiabatic charging of the load with a slowly ramping signal. That is, in the equivalent RC circuit shown in FIG. 9B, total energy dissipated is approximately equal to $2(RC/T)CV^2$. As "T" is shown representing the slowly ramped portion of the signal Φ, the $2(RC/T)CV^2$ term is very small and approaches 0 for longer ramp times T where T>>RC. It is understood that circuits of other adiabatic logic families that can be used in the circuit of FIG. 9A including, for example, families such as 2N-2P, 2N-2N2P, PAL (Pass-Transistor adiabatic logic), CAL (CMOS adiabatic logic), and TSEL (True Single-Phase Energy-Recovery Logic) that drive their outputs adiabatically.

FIG. 9C shows an example configuration of a CMOS adiabatic circuit architecture 250 including both a PMOS transistor device 252 and NMOS transistor device 254 pair having a common connection at a single terminal (e.g., drain or source) that can be employed in a row-driver circuit to be described in FIG. 10. In the adiabatic circuit 250 shown in FIG. 9C, energy dissipation is reduced by steering currents across PMOS device 252 with low voltage differences and by recycling the energy stored at a capacitive load. NMOS 254 is used to keep node y in ground or certain voltage potential during standby mode. According to the adiabatic approach in the circuit 250 of FIG. 9C, a slow ramped voltage or current signal, Φ, which may be generated from a clock waveform generator (shown in FIG. 11), applied to a terminal, may be programmed to swing gradually from 0 to $V_{dd}$ (an evaluation phase) and then swing back from $V_{dd}$ to 0 (restoration phase).

As further shown in FIG. 9C, two control inputs are provided in the form of select line 210 and its complement select line ("unselect" line) $\overline{210}$ which are control lines provided to enable adiabatic operation of the row driver circuit for the respective wordline WL.

FIG. 10 shows a schematic depicting a high-level logical architecture of an energy-efficient row driver 300 which can generate the slow ramping signal based on an adiabatic row decoding scheme, e.g., for Parallel Programming in MLC PCM (e.g., a PCM memory cell array or subarray or partition) without consuming too much power. Row-driver circuit 300 is formed using known semiconductor manufacturing lithographic masking, etching, and deposition techniques and is programmable.

More particularly, the efficient row driver apparatus 67 of FIG. 3 includes the row driver circuit architecture 300 of FIG. 10. The driver circuit architecture 300 includes a Wordline drive circuit portion 67' for providing WL drive signal when programming multiple connected PCM cells. It may include a Bit line Drive circuit portion 68' providing one or more BL drive signal(s) which may comprise conventional driver without implementing adiabatic approach. WL drive circuit portion 67' includes adiabatic logic device 302, 304 configured to drive the WL load line represented as a WL load 315 in FIG. 10. The application of WL voltage controls the access control device of MOSFET device 87 (i.e., gate turn-on voltage) of each PCM cell connected to the wordline. BL drive circuit portion 68' includes conventional logic devices 352, 354 configured to drive individual bit line represented as a BL load 365 used to program PCM cell 85. Coupled between WL load 315 and BL load 365 is a respective PCM cell 85 including its access control transistor 87. The WL conductor (load 315), in one embodiment, is connected to a gate terminal of transistor 87; one terminal (e.g., drain or source) is connected to one end of the PCM cell 85 and the other terminal (e.g., source or drain) of FET device 87 is connected to ground. The BL conductor (load 365), in one embodiment, is connected to the other terminal of the PCM cell 85. Although a single row driver circuit 300 is shown in FIG. 10, the array 80 in FIG. 3 includes plurality of circuits 300 each in one to one correspondence with a respective WL and each configured to program multiple PCM cell bits via WLs and BLs in the manner as described herein.

More particularly, each adiabatic computing elements 302, 304 of WL load driver include respective adiabatic logic circuits 301, 301' as shown in FIG. 10 that each include CMOS elements, and, in one embodiment, include a PMOS and NMOS pair such as described herein with respect to FIG. 9C. Each adiabatic computing element 302, 304 is programmed to function in a coordinated and synchronized manner according to programmed logic. In one embodiment, adiabatic logic device 302, 304 function as a multiplexer device that conduct a generated WL drive signal $\Phi_{MWL}$ to a respective wordline in adiabatic fashion according to received control signals 310 and $\overline{310}$ and 311 and $\overline{311}$ shown in FIG. 10. BL logic devices 352, 354 are programmed to function in a coordinated and synchronized manner to function as multiplexer devices that conduct one or more generated BL drive signals, such as one or more pulse signals labeled BLB, to a respective bit line according to received control signals operative on devices 352, 354. FIG. 10 shows a pulse signal or pulse waveform generator 395 for use in generating one or more pulse input signals labeled BLB.

As shown in FIG. 10, the adiabatic computing elements 302, 304 functioning as multiplexer devices receive control signals 310 and $\overline{310}$ and 311 and $\overline{311}$ provided by a programmed decoder circuits 320. More particularly, each decoder circuit 320 is programmed to generate select signals 310 and its complement (unselect) signal $\overline{310}$ for controlling respective adiabatic multiplexers 302; each decoder circuit 320 is programmed to generate select signals 311 and its complement (unselect) signal $\overline{311}$ for controlling respective adiabatic multiplexers 304; each decoder circuit 370 is programmed to generate select signals 360 and its complement unselect signal $\overline{360}$ for controlling respective conventional multiplexers 352; and each decoder circuit 370 is programmed to generate select signals 361 and its complement unselect signal $\overline{361}$ for controlling respective conventional multiplexers 354. Although two pre-decoder circuit modules are shown in FIG. 10, it is understood that there may be a single or plural programmed pre-decoder circuit generating select control signals for all adiabatic and non-adiabatic computing elements simultaneously driving PCM memory cell arrays in one or more partitions. Moreover, in one embodiment shown in FIG. 10, each of adiabatic logic devices multiplexers 302, 304 include an unselect input Sel1_bar and Sel2_bar receiving respective signals $\overline{310}$ and $\overline{311}$ (and Unselect signals $\overline{360}$) tied to a reference voltage potential such as a ground.

In operation, as shown in FIG. 10, the programmed decoder circuit 320 supplies timed select and unselect control signals that enable the applying of a generated signal to a word line terminal in an adiabatic fashion to select a row of memory cells for programming those PCM cells associated with a selected wordline. In addition, the programmed decoder circuit 370 generates timed control signals to coordinate application of one or more bitline signals to respective bit line terminals of selected one or more memory cells of said selected row concurrent with the applying said first signal to the word line terminal.

In one embodiment, adiabatic logic device 302 responds to control Select signal 310 and Select complement signal $\overline{310}$ as programmed by pre-decoder element 320 to enable receipt of a WL driver input signal $\Phi_{MWL}$ at an input of the multiplexer 302 and generate adiabatically an intermediate output signal WLA, for example, in correspondence with and for use in driving adiabatic logic device 304. That is, adiabatic logic device 302 is enabled by control signal 310, allowing signal $\Phi_{MWL}$ pass through to a selected adiabatic logic device 304. As further shown in FIG. 10, further control signal 311 and Select complement signal $\overline{311}$ as programmed by pre-decoder element 320 are generated to select a particular multiplexer, e.g., adiabatic computing element 304, in correspondence with the selected wordline, e.g., WL load 315, to program multiplexer 304 to receive the generated intermediate output signal WLA and in adiabatic fashion generate output WL drive signal 309 at its output for use in driving the selected WL to program the selected PCM cell (bit) 85 with minimal or no power consumption.

Additionally, in a likewise manner, for the applied bit-line signals, in the embodiment shown in FIG. 10, conventional multiplexer element 352 responds to control Select signal 360 and Select complement signal $\overline{360}$ as programmed by pre-decoder element 370 to enable receipt of a bitline signal labeled BLB generated for parallel programming at an input of the multiplexer 352 and generate an intermediate output signal 353, for example, in correspondence with and for use in driving single BL conductor represented as BL load 365. As further shown in FIG. 10, further control signals 361 and Select complement signal $\overline{361}$ as programmed by pre-decoder element 370 are generated to select a particular multiplexer, e.g., conventional multiplexer device 354 in correspondence with the selected bitline, e.g., BL load 365, to program multiplexer 354 to receive the generated intermediate output bitline drive signal 353, and responsively generate output BL drive signal at its output for use in driving the selected BL when programming the selected PCM cell (bit) 85. It is understood that a signal generator device, e.g., a waveform generator or pulse train generator, may be used to generate the input BLB signal(s) used to drive the single BL conductor(s) for each respective cell(s) being programmed.

It should be understood that row driver circuit 300 may be used in the simultaneous programming of each PCM cell of a plurality of memory cells in a memory array or an array partition, such as memory subarray 80 shown in FIG. 3. That is, as shown in FIG. 10, a plurality of multiplex devices 304, each including adiabatic computing elements configured as shown, may be provided. A respective multiplexer device 304 of the plurality uniquely associated with a respective WL load of the subarray or partition of PCM 85 and transistor 87 elements. In operation, one of the plurality of multiplexer devices 304 of a first set of selectable adiabatic logic devices may be selected by control signals 311, $\overline{311}$ during programming of any bit cell 85 associated with any WL of the array 80 or an array partition, to receive the intermediate output signal, e.g., WLA generated from first PCM cell 302 and generate the corresponding output WL drive signal for programming the selected bit. By implementing a programmed processor device, e.g., a microcontroller or microprocessor, functioning as or in combination with a pre-decoder, select and unselect signals are generated for use in selectively programming with logic any multiplexer device 304 associated with one WL load. For example, select and unselect control signals 311, $\overline{311}$ may be generated to turn off one multiplexor device 304 and set or turn on another multiplexer (not shown) by control signals 311, $\overline{311}$ to receive the intermediate output signal WLA from multiplexer 302 and generate a WL drive signal associated with a bit to be programmed for a PCM cell on a different WL.

Thus, as shown in FIG. 10, use of row-driver circuit 300 including programmed multiplexers 302, 304 enables generation of output WL drive signal at multiplexer output 304 having a very slow pulse with gradual increase (or decrease) in amplitude that drives the PCM WL load in a manner that exactly tracks the WL driver signal $\Phi_{MWL}$ at an input of the multiplexer 302 resulting in very little voltage drop across the PMOS and NMOS transistor device pair while consuming little or no circuit power.

Figure 11:
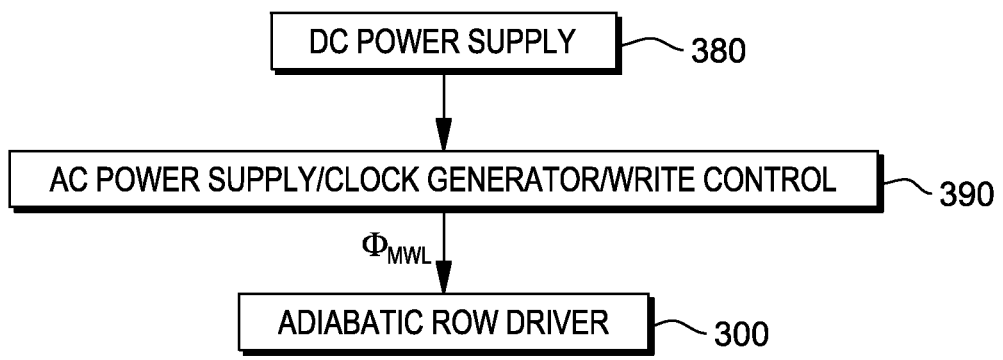
FIG. 11 shows an example system for generating the row decoder WL driver input signal $\Phi_{MWL}$ at an input of the adiabatic logic device 302 for use in the adiabatic row decoding scheme, e.g., for Parallel Programming in MLC PCM.

FIG. 11 shows an example system for generating the row decoder WL driver input signal $\Phi_{MWL}$ at an input of the multiplexer 302 for use in the adiabatic row decoding scheme, e.g., for Parallel Programming in MLC PCM. The generation of input signal $\Phi_{MWL}$ for input to adiabatic row driver circuit 300 includes, in one embodiment, a DC power supply 380 providing an input direct current voltage to an AC Power supply/clock waveform generator 390 having write control functionality suitable for programming and generating the desired $\Phi_{MWL}$ waveform.

In the manner as described herein, the input signal ($\Phi_{MWL}$) to row decoder drive circuit 300 is programmed as a slow ramping signal of decreasing amplitude or increasing amplitude such as slow ramping signals 96, 98 (FIG. 4) generated from a clock waveform generator. Depending on whether it is ramping up or down, PCM cell resistance can increase or decrease at each iteration.

In one embodiment, to improve programming accuracy, an iterative programming technique is applied to the parallel programming scheme. That is, in one embodiment, as described in detail in herein incorporated by reference commonly-owned, co-pending U.S. patent application Ser. No. 13/335,310, a modified iterative write-verify algorithm 100 is provided that governs the application of WL and corresponding application of BL pulses, for example, in order to achieve a target cell state, i.e., a characteristic parameter such as a target resistive state corresponding to a bit or binary value, for example.

Figure 5:
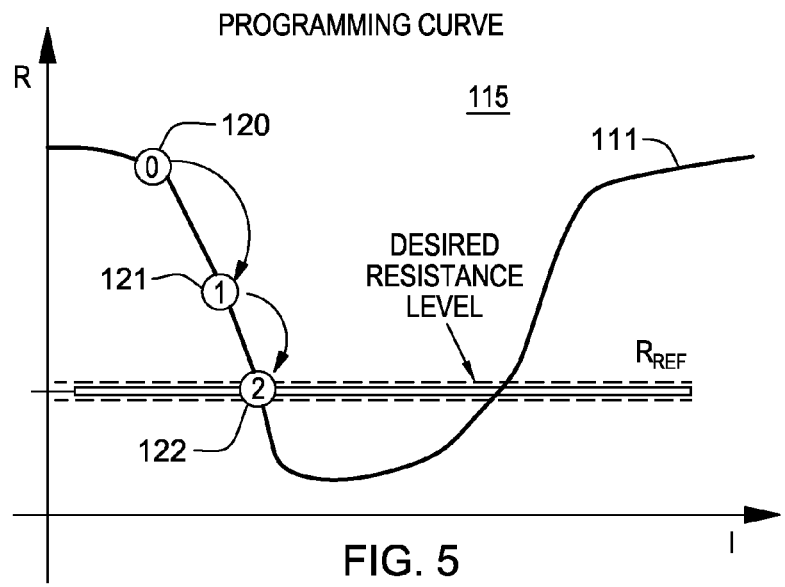
FIG. 5 depicts a plot of a programming curve 100 that is implemented by an algorithm that governs the application of WL and corresponding application of BL pulses.

FIG. 5 depicts a plot 115 of an example programming curve 111 that is implemented by a write-verify algorithm that governs the iterative programming of the target resistance state (R) into the PCM cell, e.g., programming into the desired or target PCM cell resistance state indicated as $R_{REF}$. This programming curve may be tabulated and/or used by iterative write-verify programming to adjust the applied WL voltage or current signal(s) 96, 98 and/or adjust pulse attributes 70 of applied BL pulses at the bit lines relative to the applied WL signals during the time duration T.

Figure 6:
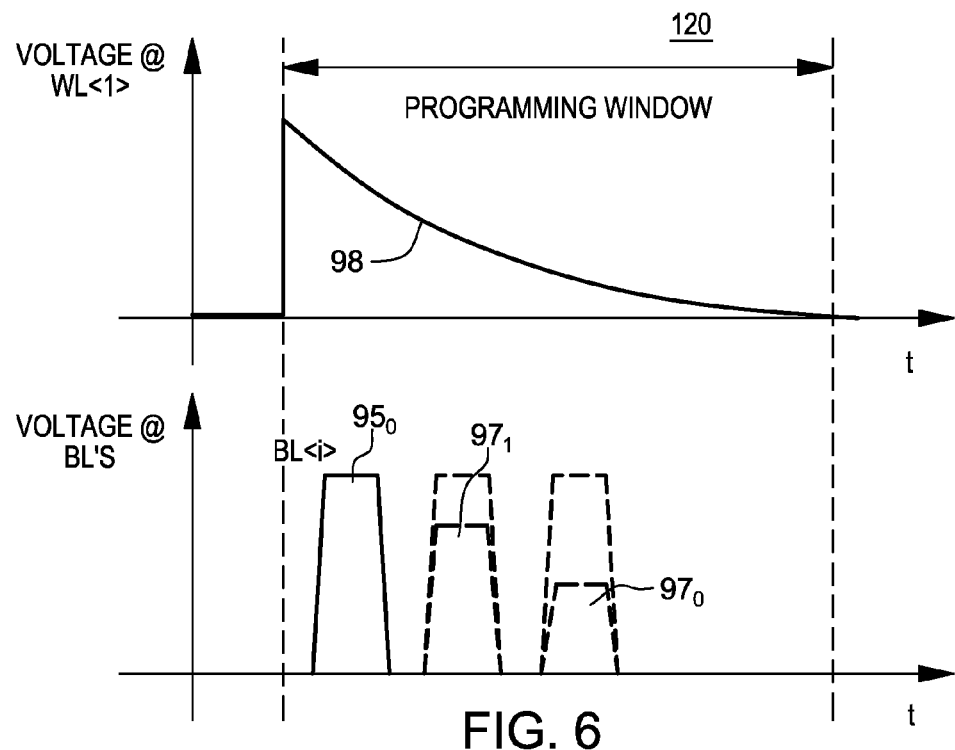
FIG. 6 shows an example programming scheme for the case of initial RESET in which WL pulse is applied to a selected wordline conductor, and a series of pulses (pulse train) is applied to a respective bitline to gradually converge into the desired resistance level.

For example, as shown in FIG. 5, the programming 115 according to the example curve 111 starts at a time corresponding to a PCM cell RESET state, which in one embodiment, may correspond to a respective high PCM cell resistance state. For the example curve shown in FIG. 5, the RESET state includes a high resistance cell state. Initially, a WL ramped signal is applied at a turn-on time (e.g., application of ramped signal 96, FIG. 4), and BL pulse 95 applied to RESET the cell into high resistance state (e.g., an upper bound resistance R) that is shown in FIG. 6 corresponding to point "0" 120 in the curve 111.

One or more additional BL pulses, e.g., a pulse sequence, maybe applied to the respective bit line within the time duration T to gradually converge the cell into the desired resistance level $R_{REF}$, e.g., by additional write-verify programming steps achieving points 121, 122 on the curve 111 labeled "0"→"1"→"2" in FIG. 5. To further improve convergence speed, gain can be adjusted dynamically, e.g., by changing the applied BL pulse amplitude. Thus, as shown in FIG. 6, for the case of initial RESET, WL ramp signal 98 is applied to a selected wordline(s) conductor(s), e.g., WL<1>, and one or more BL are applied to a respective bitline to gradually converge the state of that PCM cell into the desired resistance level, e.g., pulses 95$_0$, 97$_1$, 97$_2$, for the example shown, where a pulse attribute has been modified, e.g., amplitude of successively applied BL pulses decreases, for each successive pulse.

Figure 7:
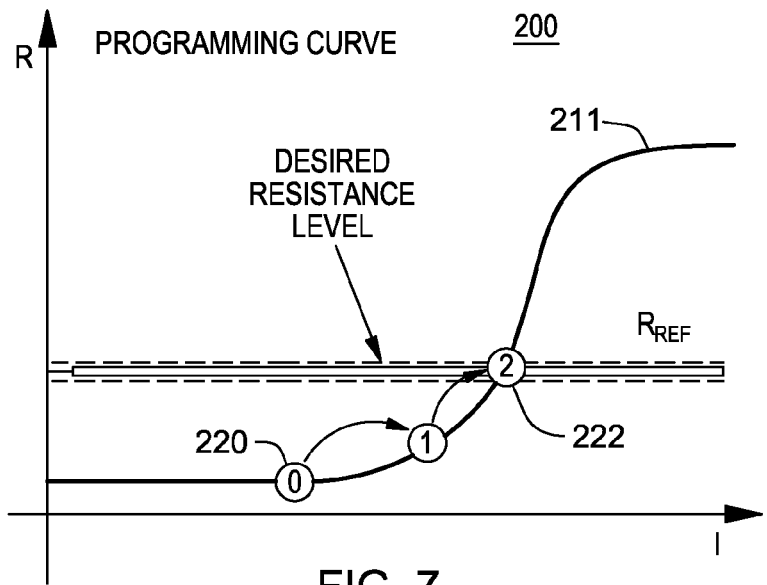
FIG. 7 depicting a plot of an iterative programming curve 200 that is implemented by an algorithm that governs the application of WL and corresponding application of BL pulses, in an example embodiment.

In a further embodiment, to improve programming accuracy, iterative programming is applied to the parallel programming scheme as shown in FIG. 7 depicting a plot 200 of a programming curve 211 that is programmed into and implemented in the write-verify algorithm that governs the signal generator's application and timing of WL and corresponding application of BL pulses, for example. This programming curve 211 can be used as a guide for adjusting the simultaneously applied WL and BL voltage or current signals.

As shown in FIG. 7, the programming according to the curve 211 starts at a time corresponding to a PCM cell SET state, which in one embodiment, may correspond to a respective low PCM cell resistance state. For the example curve shown in FIG. 7, the SET state is a low resistance state. That is, initially, a WL ramped signal is applied at a turn-on time (e.g., application of ramped signal 96, FIG. 4), and BL pulse 95 is applied to SET the cell into low resistance state (e.g., a lower bound resistance R) that is shown in FIG. 8 corresponding to point "0" 220 in the curve 222.

Figure 8:
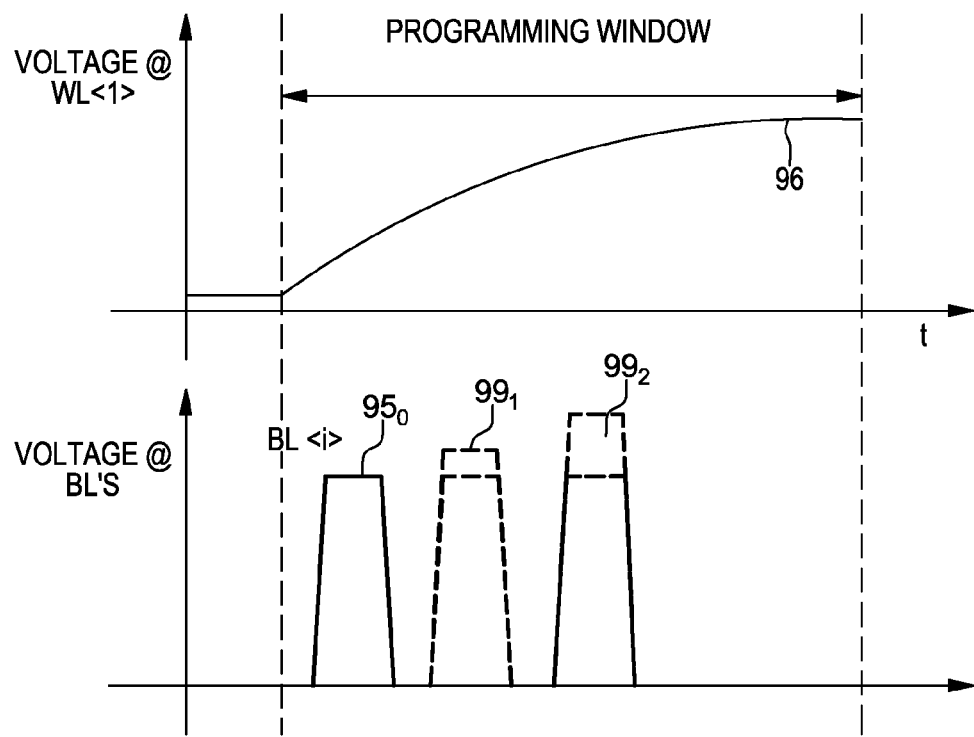
FIG. 8 shows an example programming scheme for the case of initial SET in which WL pulse is applied to a selected wordline conductor, and a series of pulses, (pulse train) is applied to a respective bitline to gradually converge into the desired resistance level.

As shown in FIG. 8, at the beginning of WL turn-on time (e.g., WL pulse 96, FIG. 4), a BL pulse is applied to SET the cell into Low resistance state (R lower bound) corresponding to point "0" in the curve 211 shown. To further improve convergence speed, gain is adjusted dynamically by changing the BL amplitude according to the applied write-verify technique. Thus, as shown in FIG. 8, for the case of initial SET, WL pulse 96 is applied to a selected wordline conductor, e.g., WL<1>, and a series of pulses, e.g., pulse sequence, is applied to a respective bitline to gradually converge into the desired resistance level, e.g., by applied pulses 95$_0$, 99$_1$, 99$_2$, for the example shown. As shown in FIG. 8, the amplitude of BL increases for each successive pulse to converge upon the target PCM resistive state indicated along the curve at 222.

It is understood that the adiabatic row driver circuit of FIG. 10 is not only applicable for parallel programming multiple PCM cells such as described in herein incorporated Ser. No. 13/335,310; any programming scheme which requires a slow WL ramping signal would benefit from the row-driver circuit described herein.

While this disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for programming a phase change memory (PCM) cell in a PCM memory cell array having a plurality of rows of word lines connected at respective word line terminals of said memory cells and plurality of columns of bit lines connected at respective bit line terminals of said memory cells, the method comprising:
    selecting an individually selectable adiabatic logic device of a set of selectable adiabatic logic devices, each adiabatic logic device of said set associated with a respective row of PCM cells;
    receiving an input ramped signal at said selected adiabatic logic device of said set of adiabatic logic devices and responsively generating a first output ramping signal in adiabatic fashion;
    applying said first output ramping signal to a word line terminal in said adiabatic fashion to select a row of memory cells for programming those PCM cells associated with the word line, said first output ramping signal applied for a defined time duration to a row corresponding to said selected adiabatic logic device; and,
    applying one or more second signals to respective bit line terminals of selected one or more memory cells of said selected row concurrent with the applying said first signal to the word line terminal.

2. The method for programming a phase change memory (PCM) cell as claimed in claim 1, further comprising:
    generating, via a first signal generator device, said ramped input signal.

3. The method for programming a phase change memory (PCM) cell as claimed in claim 1, wherein said applying one or more second signals comprises:
    generating, via a second signal generator device, during said defined time duration, bit line signals for application to a respective bit line at a respective PCM cell of said plurality, wherein a pulse attribute of said bit line signals in conjunction with the corresponding amplitude of the first signal at the word line governs a programmed state of said PCM cell.

4. The method for programming as claimed in claim 3, wherein a pulse attribute of each said bit line signals includes one or a combination of: an amplitude of, a pulse width of, a length of rising or trailing edges of, and a time delay between one or more said second bit line signals at a bit line relative to applying said first signal at a word line during said defined time duration.

5. The method for programming as claimed in claim 1, wherein said responsively generating a first output ramping signal in adiabatic fashion comprises:
    receiving said input ramped signal at a selected first adiabatic logic device and responsively generating an intermediate output ramping signal in adiabatic fashion,
    receiving said intermediate output ramping signal at a selected second adiabatic logic device and responsively generating said output ramping signal in adiabatic fashion, said output ramping signal applied for a defined time duration to said selected row.

6. The method for programming as claimed in claim 5, wherein said second adiabatic logic device is one of a set of second adiabatic logic devices, each second adiabatic logic device of said set associated with a respective row of memory cells, said method further comprising:
    selecting an individually selectable second adiabatic logic device of said set of selectable adiabatic logic devices, to receive said intermediate output ramping signal.

7. The method for programming as claimed in claim 6, wherein each first adiabatic logic device of said set is associated with one or more of said set of second adiabatic logic devices.

8. The method for programming as claimed in claim 7, wherein said applying second signals comprises:
    generating, via a second signal generator device, during said defined time duration, said bit line signals for application to a respective bit line at a respective PCM cell of said plurality, wherein a pulse attribute of said each said bit line signals in conjunction of the corresponding amplitude of the word line governs a programmed state of said PCM cell.

9. The method for programming as claimed in claim 8, wherein a pulse attribute of each said bit line signals includes one or a combination of: an amplitude of, a pulse width of, a length of rising or trailing edges of, and a time delay between one or more said second bit line signals at a bit line relative to applying said first signal at a word line during said defined time duration.

10. A drive circuit for parallel programming a plurality of phase change memory (PCM) cells organized as an array of memory cells having a plurality of rows of word lines connected at respective word line terminals of said PCM cells and plurality of columns of bit lines connected at respective bit line terminals of said memory cells, each PCM cell of said row addressable via a single word line conductor at a word line terminal of each said PCM cell, said drive circuit comprising:
    a first set of selectable adiabatic logic devices, each adiabatic logic device configured to receive a ramped signal from a first signal generator device;
    a decoding device generating a signal for selecting an individually selectable adiabatic logic device of said first set of selectable adiabatic logic devices to receive said ramped signal, a selected adiabatic logic device outputting, in response to receiving said ramped signal, an output ramping signal in said adiabatic fashion, said output ramping signal applied for a defined time duration to said single word line conductor of a selected row; and,
    respective bit line terminals of the respective memory cells of said selected row receiving one or more second signals from a second signal generator device concurrent with the applying said output ramping signal to the word line terminal.

11. The drive circuit as claimed in claim 10, wherein said second signal generator device generates, during said defined time duration, one or more bit line signals for application to a respective bit line at a respective PCM cell of said plurality, wherein a pulse shape attribute of said one or more bit line signals in conjunction with the corresponding amplitude of the first signal at the word line governs a programmed state of said PCM cell.

12. The drive circuit as claimed in claim 11, wherein a pulse shape attribute of said one or more bit line signals includes one or a combination of: an amplitude of, a pulse width of, a length of rising or trailing edges of, and a time delay between said one or more second bit line signals at a bit line relative to applying said first signal at a word line during said defined time duration.

13. The drive circuit as claimed in claim 10, wherein each said one or more adiabatic logic devices of said first set comprise a series connection of CMOS transistor devices configured to generate an output signal in said adiabatic fashion with negligible energy dissipation.

14. The drive circuit as claimed in claim 13, wherein said one or more adiabatic logic devices is selected from an adiabatic logic device family including 2N-2P, 2N-2N2P, PAL (Pass-Transistor adiabatic logic), CAL (CMOS adiabatic logic), and TSEL (True Single-Phase Energy-Recovery Logic) families.

15. A drive circuit for parallel programming a plurality of phase change memory (PCM) cells organized as an array of memory cells having a plurality of rows of word lines connected at respective word line terminals of said PCM cells and plurality of columns of bit lines connected at respective bit line terminals of said memory cells, each connected PCM cell of said row addressable via a single word line conductor at a first terminal of each said PCM cell, said circuit comprising:
- a first signal generator device for generating a ramped signal;
- a first set of selectable adiabatic logic devices, each adiabatic logic device of said first set configured to receive said ramped signal and generate an intermediate output ramping signal in adiabatic fashion,
- a second set of adiabatic logic devices, each adiabatic logic device of said second set configured to receive said intermediate output ramping signal and generate an output ramping signal in adiabatic fashion, said output ramping signal applied for a defined time duration to said single word line conductor of a selected row;
- a decoding device generating a signal for selecting an individually selectable adiabatic logic device of said first set of selectable adiabatic logic devices to receive said input ramped signal, and for selecting an individually selectable adiabatic logic device of said second set of selectable adiabatic logic devices to receive said intermediate output ramping signal; and,
- a second signal generator device for applying one or more second signals to respective bit line terminals of the memory cells of said selected row concurrent with the applying said output ramping signal to the word line terminal.

16. The drive circuit as claimed in claim 15, wherein said second signal generator device generates, during said defined time duration, one or more bitline signals for application to a respective bitline at a respective PCM cell of said plurality, wherein a pulse shape attribute of said one or more bit line signals in conjunction with the corresponding amplitude of the first signal at the word line governs a programmed state of said PCM cell.

17. The row drive circuit as claimed in claim 16, wherein a pulse shape attribute of said one or more bit line signals includes one or a combination of: an amplitude of, a pulse width of, a length of rising or trailing edges of, and a time delay between said one or more second bit line signals at a bit line relative to applying said first signal at a wordline word line during said defined time duration.

18. The drive circuit as claimed in claim 15, wherein each said one or more adiabatic logic devices of said first and second sets comprise a series connection of CMOS transistor devices configured to generate an output signal in said adiabatic fashion with negligible energy dissipation.

19. The drive circuit as claimed in claim 18, wherein each said first and second sets of one or more adiabatic logic devices is selected from an adiabatic logic device family including 2N-2P, 2N-2N2P, PAL (Pass-Transistor adiabatic logic), CAL (CMOS adiabatic logic), and TSEL (True Single-Phase Energy-Recovery Logic) families.

* * * * *